US010157748B2

(12) United States Patent
Fung

(10) Patent No.: US 10,157,748 B2
(45) Date of Patent: *Dec. 18, 2018

(54) FIN PROFILE IMPROVEMENT FOR HIGH PERFORMANCE TRANSISTOR

(71) Applicant: TAIWAN SEMICONDUCTOR MANUFACTURING CO., LTD., Hsinchu (TW)

(72) Inventor: Ka-Hing Fung, Hsinchu (TW)

(73) Assignee: Taiwan Semiconductor Manufacturing Co., Ltd. (TW)

( * ) Notice: Subject to any disclaimer, the term of this patent is extended or adjusted under 35 U.S.C. 154(b) by 0 days.

This patent is subject to a terminal disclaimer.

(21) Appl. No.: 15/183,363

(22) Filed: Jun. 15, 2016

(65) Prior Publication Data

US 2017/0229310 A1    Aug. 10, 2017

Related U.S. Application Data

(63) Continuation-in-part of application No. 15/018,175, filed on Feb. 8, 2016.

(51) Int. Cl.
| | |
|---|---|
| *H01L 21/3065* | (2006.01) |
| *H01L 21/306* | (2006.01) |
| *H01L 29/78* | (2006.01) |
| *H01L 29/417* | (2006.01) |
| *H01L 29/06* | (2006.01) |
| *H01L 29/66* | (2006.01) |
| H01L 21/308 | (2006.01) |
| H01L 21/8238 | (2006.01) |
| H01L 27/092 | (2006.01) |

(52) U.S. Cl.
CPC ...... *H01L 21/3065* (2013.01); *H01L 21/3081* (2013.01); *H01L 29/0653* (2013.01); *H01L 29/41791* (2013.01); *H01L 29/66795* (2013.01); *H01L 29/785* (2013.01); *H01L 21/308* (2013.01); *H01L 21/823878* (2013.01); *H01L 27/0924* (2013.01)

(58) Field of Classification Search
CPC ......... H01L 21/823821; H01L 21/3065; H01L 21/308; H01L 21/823878; H01L 27/0924; H01L 29/0657; H01L 29/66553; H01L 21/3081; H01L 29/0653; H01L 29/41791; H01L 29/66795; H01L 29/785
USPC ....................................... 257/401
See application file for complete search history.

(56) References Cited

U.S. PATENT DOCUMENTS

2005/0169096 A1*  8/2005  Lee ................. C09K 13/08
                                                              365/232
2012/0104472 A1*  5/2012  Xu ................. H01L 29/66795
                                                              257/288

(Continued)

*Primary Examiner* — Stephen Bradley
*Assistant Examiner* — Patricia Reddington
(74) *Attorney, Agent, or Firm* — Sterne, Kessler, Goldstein & Fox P.L.L.C.

(57) ABSTRACT

A finFET semiconductor device and method for fabricating such a device are presented. The semiconductor device includes a first fin formed in a first semiconducting layer, a second fin formed in a second semiconductor layer, and an insulating layer disposed between the first fin and the second fin. The first fin, the second fin, and the insulating layer form a stacked structure above a substrate. Sidewalls of the first fin are substantially more vertical than sidewalls of the second fin.

20 Claims, 15 Drawing Sheets

(56) References Cited

U.S. PATENT DOCUMENTS

| | | | |
|---|---|---|---|
| 2014/0099776 A1* | 4/2014 | Cheng | H01L 29/165 438/458 |
| 2015/0372104 A1* | 12/2015 | Liu | H01L 29/42364 257/77 |
| 2016/0056271 A1* | 2/2016 | Liaw | H01L 29/7853 438/591 |
| 2016/0225849 A1* | 8/2016 | Wong | H01L 29/0673 |
| 2017/0077301 A1* | 3/2017 | Pawlak | H01L 29/7848 |
| 2017/0162651 A1* | 6/2017 | Suk | H01L 29/0673 |

\* cited by examiner

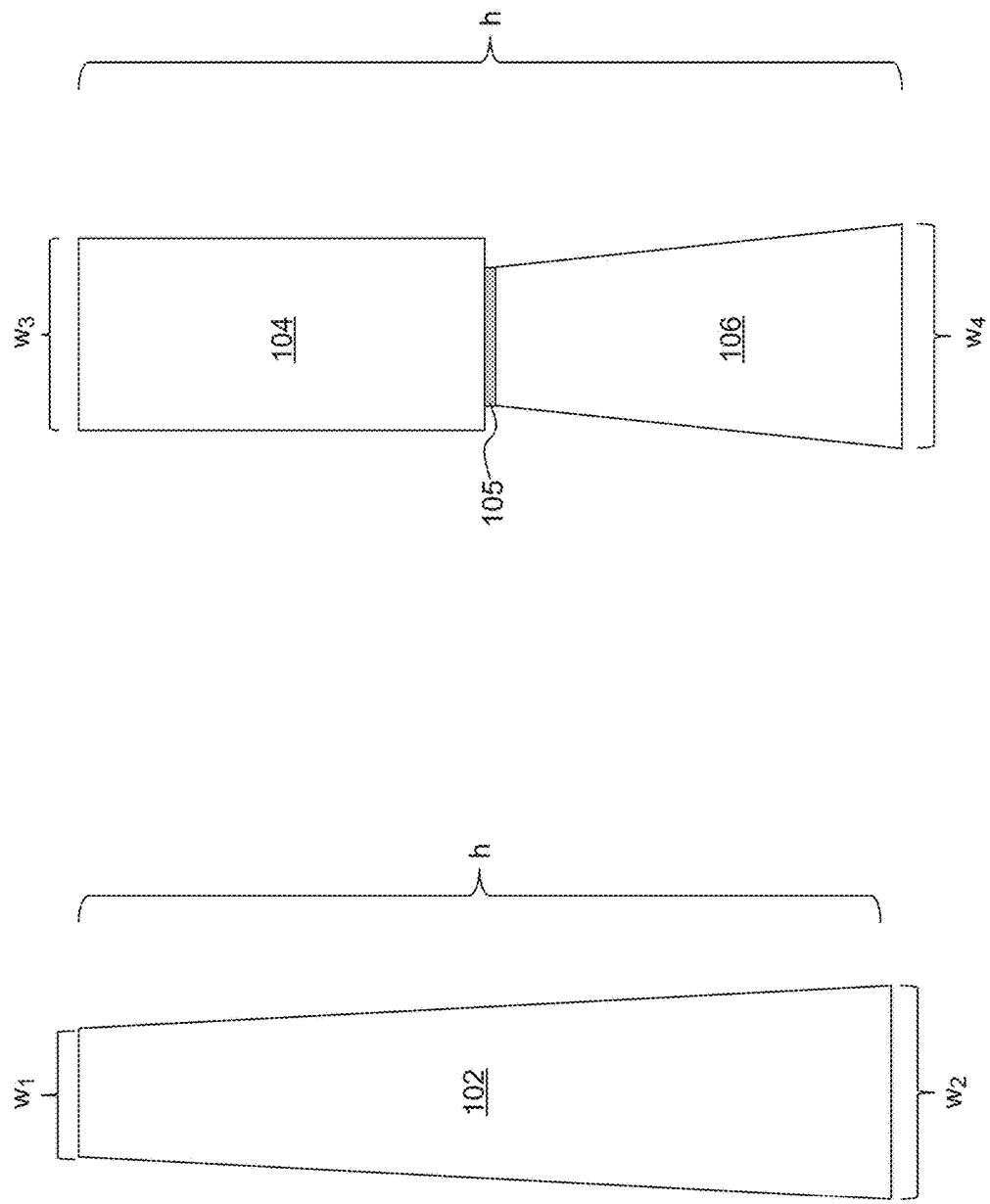

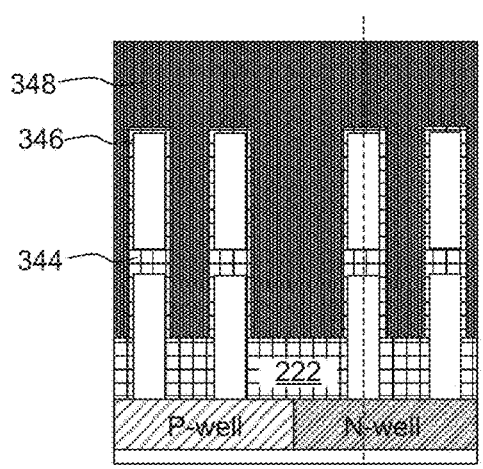
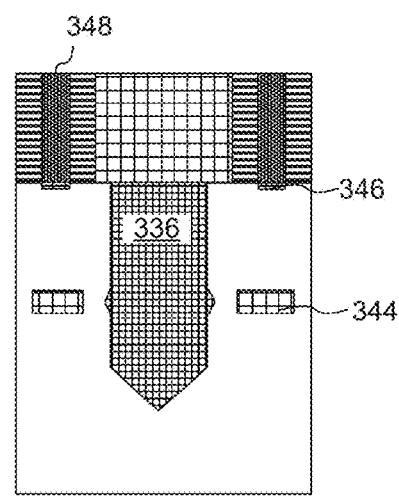
FIG. 3Q                    FIG. 3R

FIN PROFILE IMPROVEMENT FOR HIGH PERFORMANCE TRANSISTOR

CROSS REFERENCE TO RELATED APPLICATIONS

This application is a continuation-in-part of U.S. application Ser. No. 15/018,175 filed on Feb. 8, 2016, the disclosure of which is incorporated by reference herein in its entirety.

BACKGROUND

Many developments in both semiconductor structures and manufacturing processes have contributed to reducing the size and increasing the performance of integrated circuits. One recent advance in semiconductor structures has been the introduction of a transistor structure referred to as a finFET. FinFETs include high-aspect ratio structures, which can cause unwanted tapering of the structures during the etching process.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 1A is a cross-sectional view of an example fin of a finFET after etching of the fin.

FIG. 1B is a cross-sectional view an example finFET structure that includes stacked fins, according to an embodiment.

DETAILED DESCRIPTION

Figure 2B:
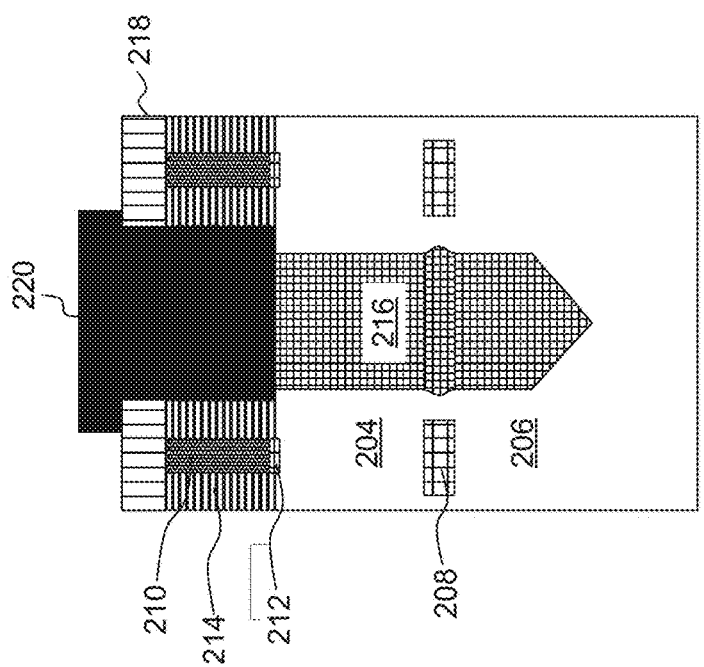
FIGS. 2A and 2B are cross-sectional views of a finFET device, according to an embodiment.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The acronym "FET," as used herein, refers to a field effect transistor. A very common type of FET is referred to as a metal oxide semiconductor field effect transistor (MOSFET). Historically, MOSFETs have been planar structures built in and on the planar surface of a substrate such as a semiconductor wafer. But recent advances in semiconductor manufacturing have resulted in the use vertical structures.

The term "finFET" refers to a FET that is formed over a fin that is vertically oriented with respect to the planar surface of a wafer.

The term "S/D" refers to the source/drain junctions that form two of the four terminals of a FET.

The expression "epitaxial layer" herein refers to a layer or structure of single crystal semiconductor material. Likewise, the expression "epitaxially grown" herein refers to a layer or structure of single crystal semiconductor material.

The expression "high-k" refers to a high dielectric constant. In the field of semiconductor device structures and manufacturing processes, high-k refers to a dielectric constant that is greater than the dielectric constant of $SiO_2$ (i.e., greater than 3.9).

The term "vertical," as used herein, means nominally perpendicular to the surface of a substrate.

Overview

Various embodiments in accordance with this disclosure provide finFET devices having a high aspect ratio with an improved profile. In this context, an improved profile refers to the fin of the finFET device having less of a taper than those found in conventional finFET devices.

FIG. 1A is a cross-sectional view of an exemplary fin 102 that has been etched from a bulk substrate to have a height h, a first width $w_1$ at a top surface and a second width $w_2$ at a bottom surface. Due to the etching process of high-aspect ratio structures, fin 102 has a tapered profile resulting in a larger width at the bottom than at the top. In some examples, the difference between the top and bottom widths $(w_2-w_1)$ is greater than 4 nm for a height h between about 40 nm to 80 nm. This tapered structure can make it difficult to form finFET devices with gate lengths less than 5 nm, or gate lengths less than 3 nm.

FIG. 1B is a cross-sectional view of an example of another fin structure for a finFET device that includes a first fin 104 patterned over a second fin 106, and having one or more dielectric layers 105 between first fin 104 and second fin 106, according to an embodiment. Since the etching may be performed using two separate etches, first fin 104 may be etched to have straighter side walls than second fin 106, as will be discussed in more detail herein. The overall resulting structure comprising both fins has less sidewall taper between the top width and the bottom width. For example, the difference between the top and bottom widths $(w_4-w_3)$ is less than about 3 nm for the same height h between about 40 nm to 80 nm. As such, the width of each of first fin 104 and second fin 106 may be adjusted in any way. For example, $w_4$ may be larger than $w_3$ by anywhere between about 0 and 3 nm, or $w_4$ may be smaller than $w_3$ by anywhere between about 0 and 3 nm.

It should be understood that the fin structure illustrated in FIG. 1B may include more than two stacked fins. For example, three fins may be patterned in different semiconducting material layers stacked over each other with one or more dielectric layers between each fin. Furthermore, the individual heights of each fin may be adjusted (e.g., the height of each fin does not need to be equal.) For example, first fin 104 and second fin 106 may have height ratios of 1:2, 1:1, or 2:1. In one particular example, for finFETs having a gate length approaching 5 nm, first fin 104 and second fin 106 would have about a 1:1 height ratio. Each of fins 104 and 106 may be etched in separate semiconductor layers. For example, each of fins 104 and 106 are etched in layers of silicon.

Figure 2A:
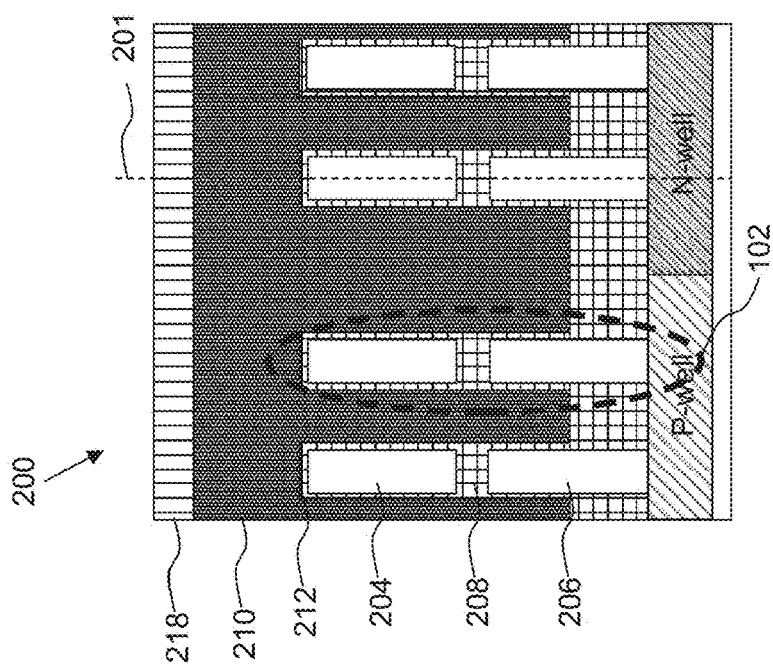

FIGS. 2A and 2B are cross-sectional views of a semiconductor device 200 having improved finFET profiles according to an embodiment. FIG. 2B is a cross section taken through the plane 201 shown in FIG. 2A.

Semiconductor device 200 includes a number of finFETs 102, with each finFET including a first fin 204, a second fin 206, and an insulating layer 208 between first fin 204 and second fin 206. In this way, first fin 204, insulating layer 208, and second fin 206 create a stacked structure over the substrate, according to an embodiment. First fin 204 and second fin 206 may be patterned from silicon while insulating layer 208 may be silicon dioxide. A metal gate 210 is deposited over a gate dielectric layer 212, and may have spacers 214 patterned on either side of metal gate 210. Additionally, as shown in the cross section of FIG. 2B, a conductive material 216 is epitaxially grown within S/D regions to form the source or drain of neighboring finFET devices. A contact 220 is patterned to make electrical connection with conductive material 216. In one example, conductive material 216 includes silicon germanium and contact 220 includes tungsten or aluminum. A masking layer 218 may be provided to help isolate metal gate 210 from contact 220.

By forming each finFET with two (or more) etched fins, rather than using one etched fin, the sidewall taper of the overall structure may be reduced. For example, the sidewalls of first fin 204 may be straightened by applying a high energy during the reactive ion etch of first fin 204. An etch-stop layer may be patterned between first fin 204 and second fin 206 to act as a hard mask for biasing the etch of second fin 206. The result of the separate etching processes is an improved overall profile for the finFET device. The improved finFET profile may be used to provide devices with gate lengths less than 5 nm, or gate lengths less than 3 nm.

Figure 3A:
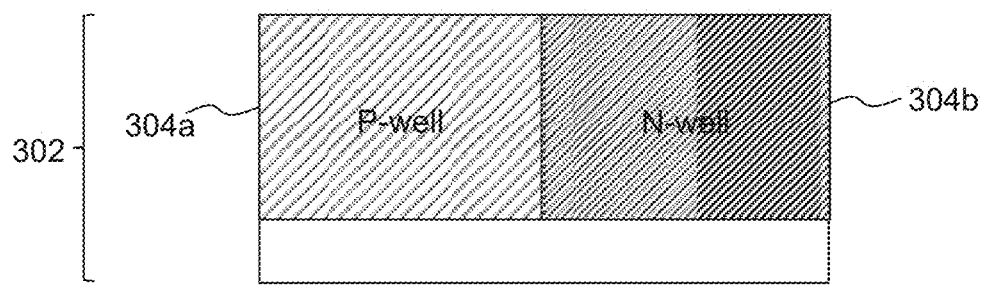
FIGS. 3A-3T are cross-sectional views of an example process flow for fabricating the finFET device, according to some embodiments.
Figure 3B:
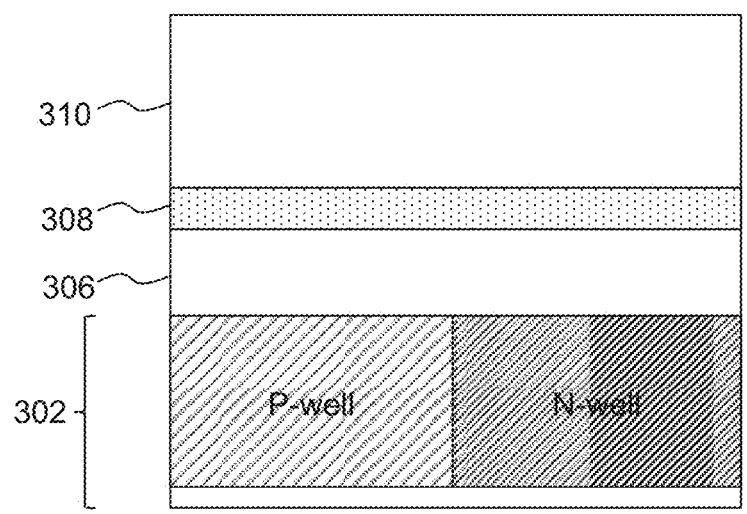
Figure 3C:
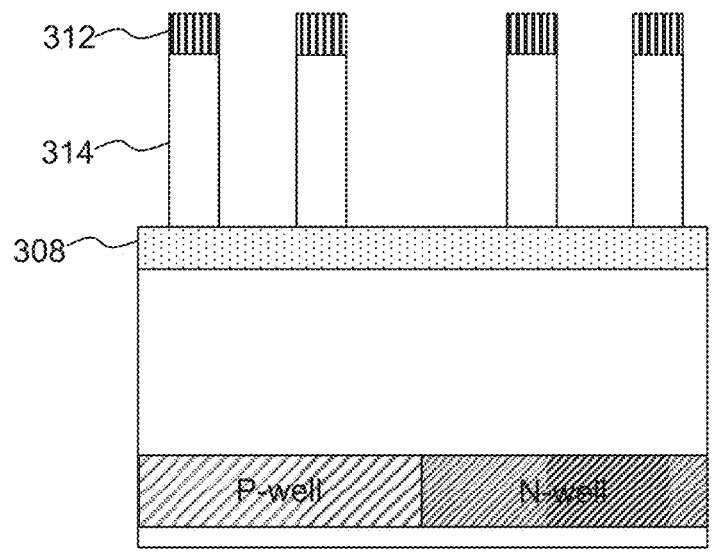
Figure 3D:
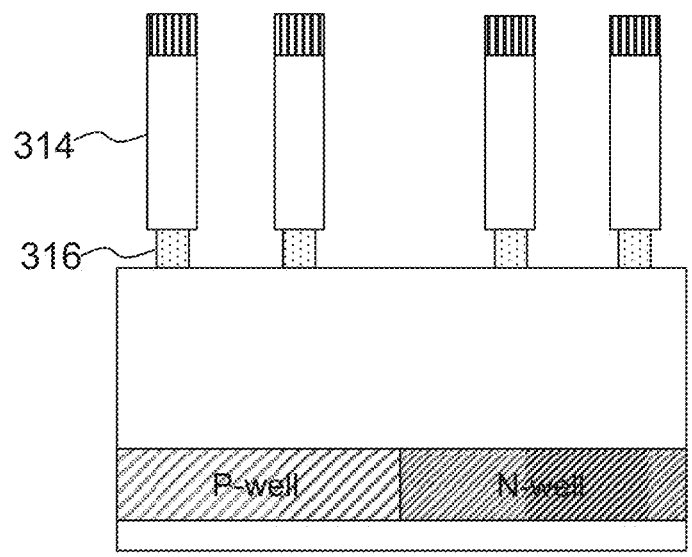
Figure 3E:
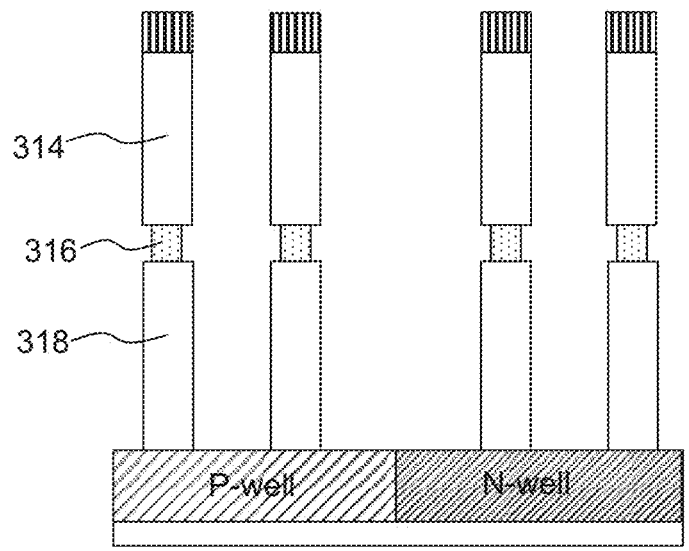
Figure 3F:
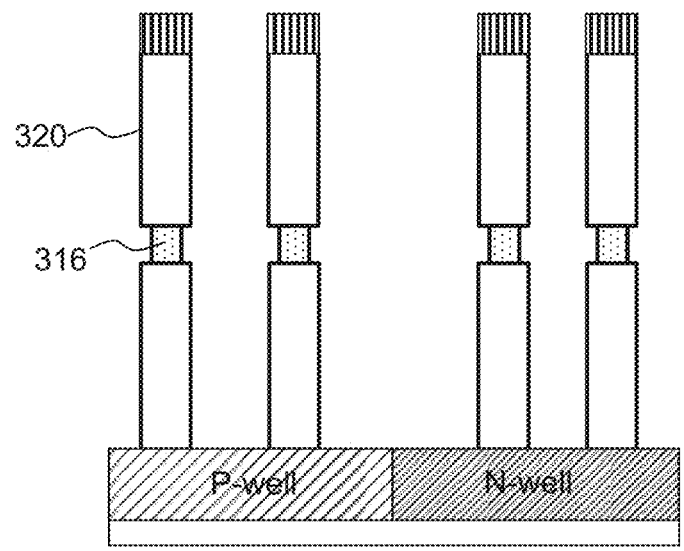
Figure 3G:
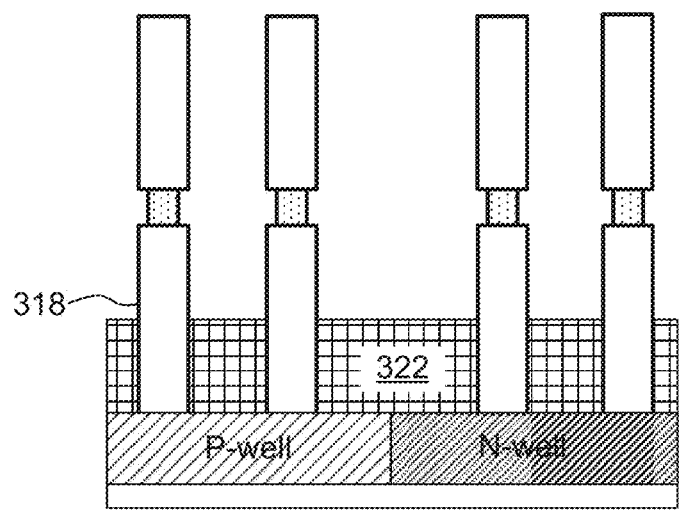
Figure 3H:
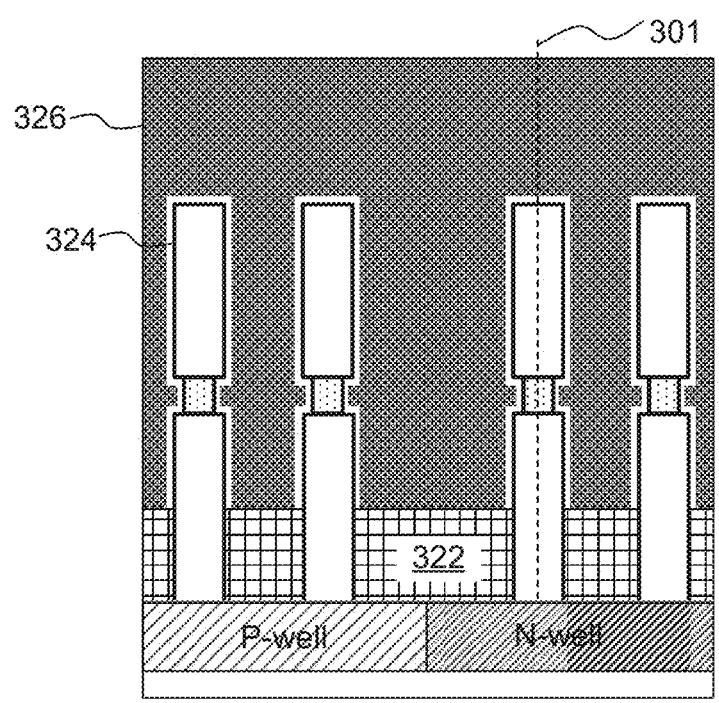
Figure 3I:
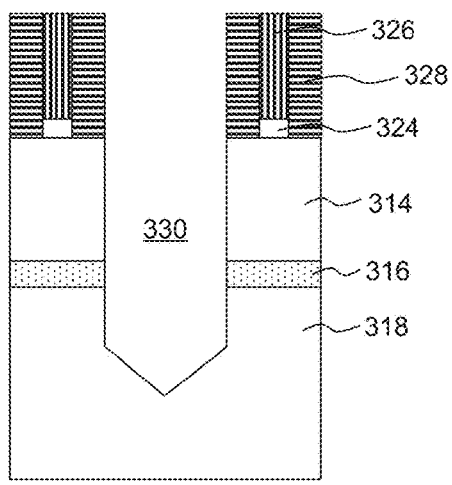
Figure 3J:
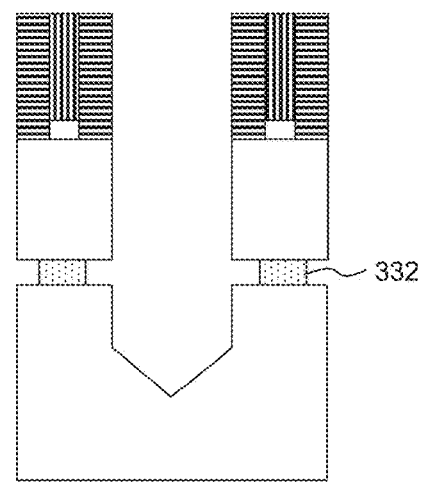
Figure 3K:
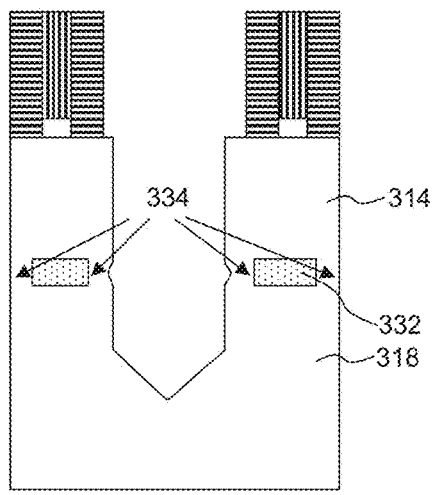
Figure 3L:
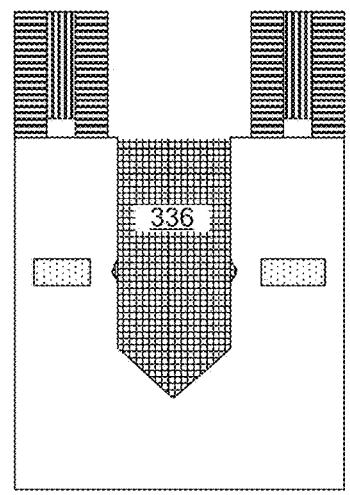
Figure 3M:
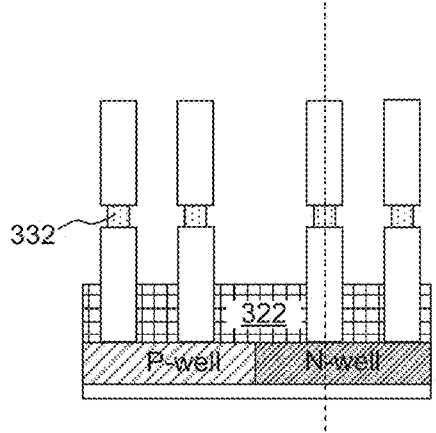
Figure 3N:
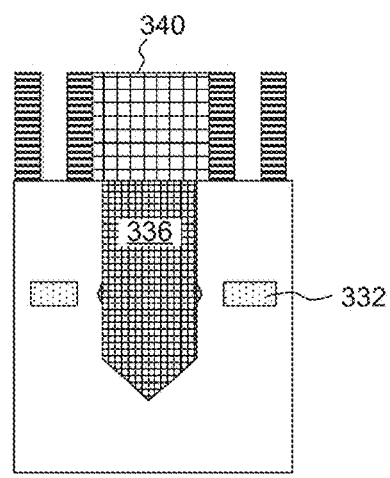
Figure 3O:
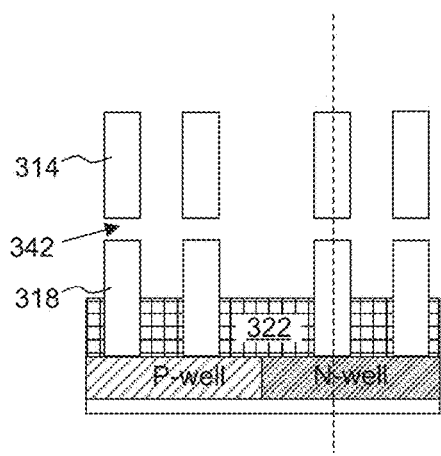
Figure 3P:
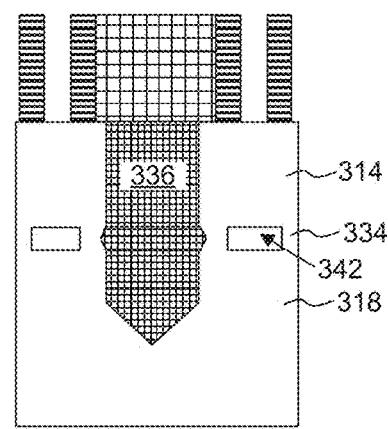
Figure 3S:
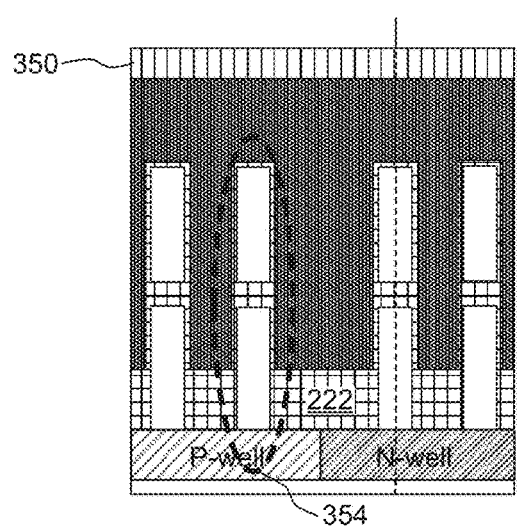
Figure 3T:
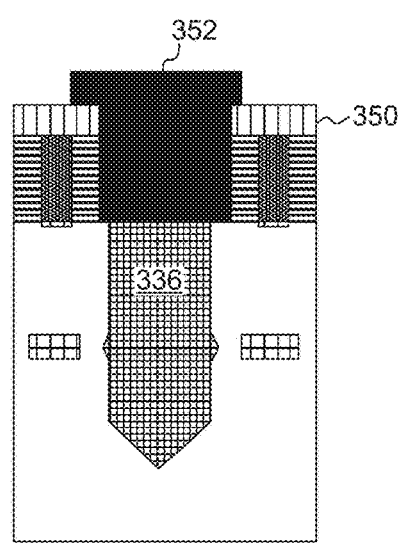

FIGS. 3A-3T illustrate an example process flow for fabricating semiconductor device 200, according to an embodiment. It should be understood that other fabrication steps not illustrated may also be performed.

FIG. 3A illustrates a substrate 302. Substrate 302 may be a silicon substrate, or any other semiconducting material. In one example, substrate 302 is doped to form a p-well 304a and an n-well 304b. Any standard doping process, such as plasma doping or ion implantation may be used to form the doped wells. Example p-type dopants include boron, while example n-type dopants include phosphorous or arsenic. In another embodiment, substrate 302 is not doped.

FIG. 3B illustrates three layers being disposed over substrate 302. The three layers may include a first semiconductor layer 306, an intermediate layer 308, and a second semiconductor layer 310. In an embodiment, intermediate layer 308 is a material that is lattice matched with the material of first semiconductor layer 306 and second semiconductor layer 310. For example, first semiconductor layer 306 and second semiconductor layer 310 may be silicon while intermediate layer 308 is silicon germanium (SiGe). Each of first semiconductor layer 306, intermediate layer 308, and second semiconducting layer 310 may be epitaxially grown over substrate 302. First semiconductor layer 306 and second semiconductor layer 310 may each have a thickness between about 5 nm and 50 nm. Intermediate layer 308 may have a thickness between about 2 nm and 10 nm.

FIG. 3C shows the structure of FIG. 3B subsequent to an etching process of second semiconductor layer 310 to form one or more first fins 314, according to an embodiment. A hard mask layer is formed on semiconductor layer 310 and then patterned to form hard mask 312, which protects the portion of semiconductor layer 310 beneath it during the etching process. In an embodiment, the etching of second semiconductor layer 310 continues until intermediate layer 308 is exposed, effectively acts as an etch stop.

Semiconductor layer 310 may be etched using any well-known silicon etch chemistry when semiconductor layer 310 is silicon. For example, carbon-based or fluorine based etches may be used. Other wet etch chemistries may be used, such as tetramethyl-ammonium-hydroxide (TMAH), or potassium hydroxide (KOH). A reactive ion etch (RIE) or deep reactive ion etch (DRIE) process may be used to form first fins 314. Due to the presence of intermediate layer 308 as an etch stop, a high RIE energy may be applied to create more vertical sidewalls of first fins 314, according to an embodiment. For example, sidewalls having a slope between about 80 degrees and about 90 degrees may be achieved for the sidewalls of first fins 314 following the etching process.

In one example, first fins 314 are formed using a dry etching processes with between about 50 sccm and about 200 sccm of $Cl_2$/HBr gas at a pressure between about 10 mTorr and about 50 mTorr. The temperature during the etch may range from about room temperature to about 200 degrees C. The RF power applied during the etch may range from about 200 W to about 400 W, while the bias voltage may range between about −20 volts and about 20 volts. A relatively high RF power may be applied to form first fins 314 with more vertical sidewalls due to the presence of intermediate layer 308, which acts as an etch stop.

FIG. 3D shows the structure of FIG. 3C after an etching process is performed on intermediate layer 308, which includes a lateral etch under first fins 314 to form strips 316, according to an embodiment. The lateral etch may be between about 1 nm and 5 nm per side, or between about 1 nm and 3 nm per side. Any known etching chemistry may be used to etch intermediate layer 308. For example, fluorine, chlorine, or bromine based plasma etches may be used when intermediate layer 308 includes silicon germanium. In one example, intermediate layer 308 is silicon germanium and is etched by a mixture of $H_2O$:$NH_4OH$:$H_2O_2$ in either a vapor or liquid phase. The temperature during the etch of intermediate layer 308 may range anywhere between room temperature and about 100 degrees C.

FIG. 3E shows the structure of FIG. 3D after an etching process is performed on first semiconductor layer 306 to form one or more second fins 318, according to an embodiment. The etching process to form second fins 318 may use a similar etch chemistry to that used to form first fins 314. Strips 316 between first fins 314 and second fins 318 may act as a masking layer for the etch of second fins 318. The sidewalls of second fins 318 may taper more than the sidewalls of first fins 314, according to an embodiment. For example, sidewalls having a slope between about 70 degrees and about 85 degrees may be achieved for the sidewalls of second fins 318 following the etching process.

In one example, second fins 318 are formed using a dry etching processes with between about 50 sccm and about 200 sccm of $Cl_2$/HBr gas at a pressure between about 10 mTorr and about 50 mTorr. The temperature during the etch may range from about room temperature to about 200 degrees C. The RF power applied during the etch may be lower than that used to form first fins 314. For example, the RF power applied during the etch may range from about 100 W to 300 W, while the bias voltage may range between about −20 volts and about 20 volts.

FIG. 3F shows the structure of FIG. 3E after the formation of a silicon layer 320, according to an embodiment. Silicon layer 320 may be formed using any known method, such as chemical vapor deposition, sputtering, or epitaxial growth. Silicon layer 320 may be used to protect strips 316 during subsequent process steps, however, the inclusion of silicon layer 320 is optional.

FIG. 3G shows the structure of FIG. 3F after the deposition of shallow-trench isolation (STI) material 222 and the removal of hard mask 312, according to an embodiment. STI material 222 may be recessed after deposition such that a top surface of STI material 222 is below a top surface of second fins 318. STI material 222 may be any electrically insulating material, such as silicon dioxide.

FIG. 3H shows the structure of FIG. 3G after the deposition of sacrificial dielectric 324 and sacrificial gate 326, according to an embodiment. Sacrificial dielectric 324 may be silicon dioxide, or may represent a stack of insulating layers, such as oxide, nitride, oxide (ONO). Sacrificial gate 326 may be polysilicon. A chemical-mechanical polishing (CMP) process may be performed to planarize a top surface of sacrificial gate 326.

FIG. 3I illustrates a second cross-section taken through plane 301 to better visualize the remaining fabrication steps. Spacers 328 may be disposed on either side of sacrificial gate 326 using deposition followed by an anisotropic etchback process. Spacers 328 may be silicon nitride, silicon dioxide, or any other insulating material with a high etch selectivity relative to polysilicon.

Before spacers 328 are disposed, first fins 314 and second fins 318 may be either p-doped (to form a p-channel finFET) or n-doped (to form a n-channel finFET) using sacrificial gate 326 as a mask.

According to an embodiment, recess 330 may be etched through first fins 314 and second fins 318 to create source/drain (S/D) regions. Spacers 328 may provide masking for the etch of recess 330. Recess 330 may be etched through the stack of first fin 314, strip 316, and second fin 318.

FIG. 3J illustrates an additional lateral etch performed on strips 316 to form undercut strips 332. The etch of strips 316 may be similar to the etch used to etch intermediate layer 308.

FIG. 3K illustrates epitaxial growth of silicon bridges 334 around the exposed edges of undercut strips 332, according to an embodiment. Silicon bridges 334 connect first fin 314 to second fin 318 around the sides of undercut strips 332.

FIG. 3L illustrates the deposition of S/D material 336 within recess 330. S/D material 336 may include silicon germanium, and acts as the source or drain for each neighboring finFET device. S/D material 336 may be doped with either n-dopants or p-dopants. For example, S/D material 336 may include phosphorous-doped silicon (n-doped) or boron-doped silicon germanium (p-doped). In one embodiment, S/D material 336 completely fills recess 330.

FIGS. 3M and 3N illustrate the removal of sacrificial gate 326 and sacrificial dielectric 324, according to an embodiment. FIG. 3N illustrates a cross-section taken through the dotted line in FIG. 3M. Optionally, an insulating plug 340 may be deposited over S/D material 336 between neighboring finFET devices. Insulating plug 340 may include silicon dioxide and have its top surface planarized using CMP.

FIGS. 3O and 3P illustrate the removal of undercut strips 332, leaving voids 342 between first fin 314 and second fin 318, according to an embodiment. FIG. 3P illustrates a cross-section taken through the dotted line in FIG. 3O. First fin 314 and second fin 318 are connected via silicon bridges 334. An etch chemistry may be used that selectively removes undercut strips 332, and provides little to no etching of first fin 314 and second fin 318.

FIGS. 3Q and 3R illustrate the formation of insulating layer 344 and metal gate 348, according to an embodiment. FIG. 3R illustrates a cross-section taken through the dotted line in FIG. 3Q. Insulating layer 344 may include silicon dioxide and may fill voids 342 between first fin 314 and second fin 318. Insulating layer 344 may be deposited using atomic layer deposition (ALD) to fill voids 342. The same deposition process may also form gate dielectric 346 beneath metal gate 348. In another example, a separate deposition step is performed to form gate dielectric 346. Insulating layer 344 may represent a stack of insulating layers, such as silicon dioxide and a high-k dielectric, or a stack of silicon dioxide, a high-k dielectric, and titanium nitride. Metal gate 348 may fill the areas left behind by the removal of sacrificial gate 326. A top surface of metal gate 348 may be planarized using a CMP process.

FIGS. 3S and 3T illustrate the formation of a contact 352 to make electrical contact with S/D material 336, according to an embodiment. FIG. 3T illustrates a cross-section taken through the dotted line in FIG. 3S. A masking layer 350 may first be deposited to protect metal gate 348 from shorting with contact 352. Contact 352 may be a metal contact, such as tungsten or aluminum.

The resulting finFET device 354 includes a stacked structure of a first fin 314, an insulating layer 344, and a second fin 318. The cross section taken through plane 301 also illustrates how S/D material 336 is disposed on either side of a finFET device to form its S/D regions. According to an embodiment, a difference between a top width of first fin 314 and a bottom width of second fin 318 is less than about 3 nm.

As previously described, a thickness of intermediate layer 308 sets the gap spacing between first fin 314 and second fin 318 within each finFET device, according to an embodiment. Once this layer has been removed, the void left behind is filled with dielectric layers that also form the gate dielectric of the finFET device. The gap distance may contribute in dictating what dielectric layers exist in the space between first fin 314 and second fin 318.

FIGS. 4A-4E illustrate cross-sectional views of various material layers that may be deposited between first fin 314 and second fin 318, according to some embodiments. Depending on a thickness of the gap between first fin 314 and second fin 318, a different number of layers may be deposited within the gap.

Figure 4B:
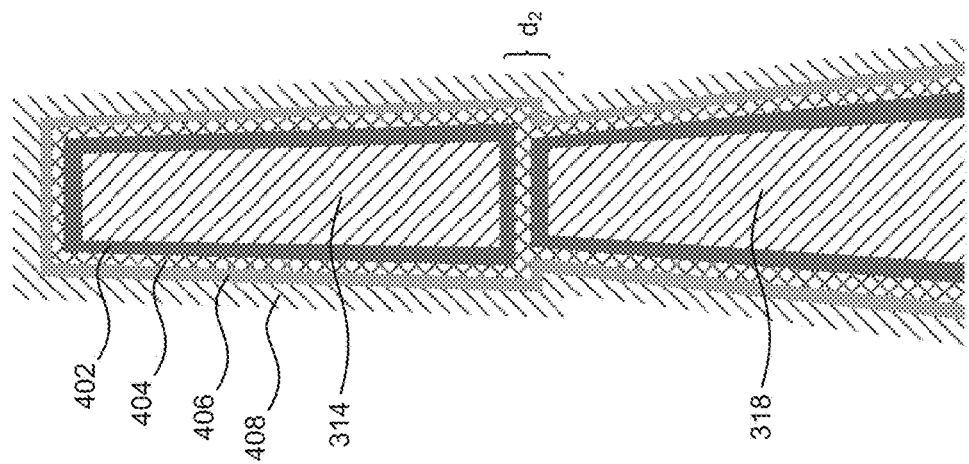
FIGS. 4A-4E illustrate cross-sectional views of various material layers that may be deposited between stacked fins, according to some embodiments.
Figure 4A:
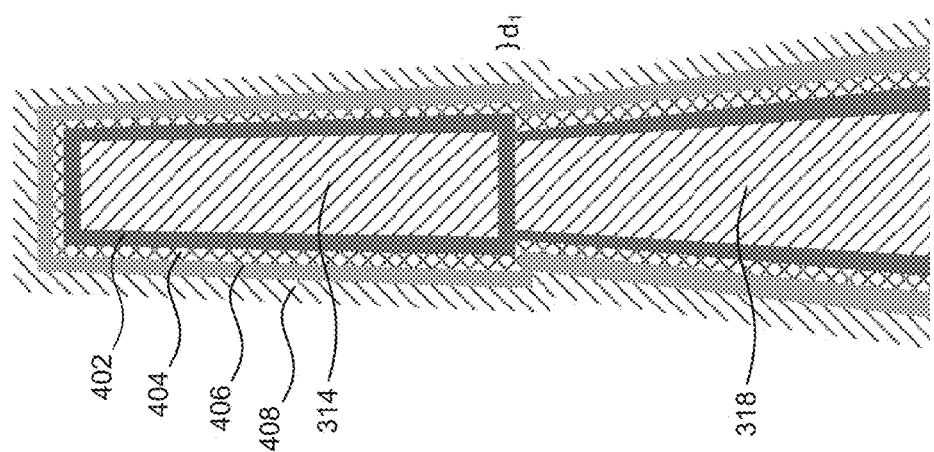

FIG. 4A illustrates first fin 314 and second fin 318 having a gap thickness $d_1$ that may be less than about 3 nm, according to an embodiment. The gap is filled with a first dielectric layer 402, which may be the same as insulating layer 344, and may be silicon dioxide. In an example, dielectric layer 402 is deposited using ALD to provide a conformal coating around first fin 314 and second fin 318 while filling the gap between the two fins. Additional layers may be deposited over first dielectric layer 402, including a second dielectric layer 404, a third dielectric layer 406, and a metallic layer 408. Second dielectric layer 404 may be a high-k dielectric material. Third dielectric layer 406 may be titanium nitride. Metallic layer 408 may be the same as metal gate 348, and may contain tungsten. Any of the layers deposited over first dielectric layer 402 may be deposited using ALD, chemical vapor deposition (CVD), or sputtering. Second dielectric layer 404 and third dielectric layer 406 may also be deposited using flowable CVD.

FIG. 4B illustrates first fin 314 and second fin 318 having a gap thickness $d_2$ that may be between about 3 nm and 5 nm, according to an embodiment. The gap is filled with first dielectric layer 402 and second dielectric layer 404. Both dielectric layers 402 and 404 may be deposited using ALD to provide a conformal coating around first fin 314 and second fin 318 while filling the gap between the two fins. Additional layers may be deposited over first dielectric layer 402 and second dielectric layer 404, such as third dielectric layer 406, and metallic layer 408. Any of the layers deposited over first dielectric layer 402 and second dielectric layer 404 may be deposited using ALD, chemical vapor deposition (CVD), or sputtering. Third dielectric layer 406 may also be deposited using flowable CVD.

Figure 4D:
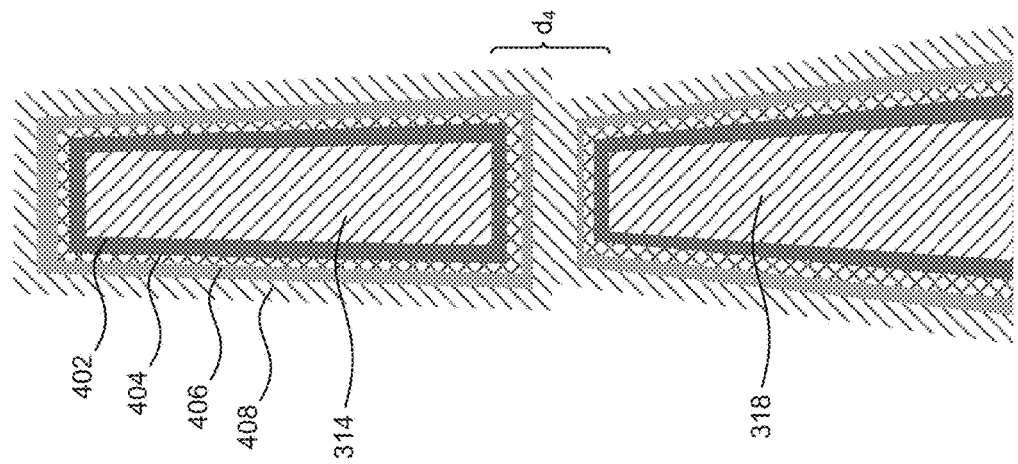
Figure 4C:
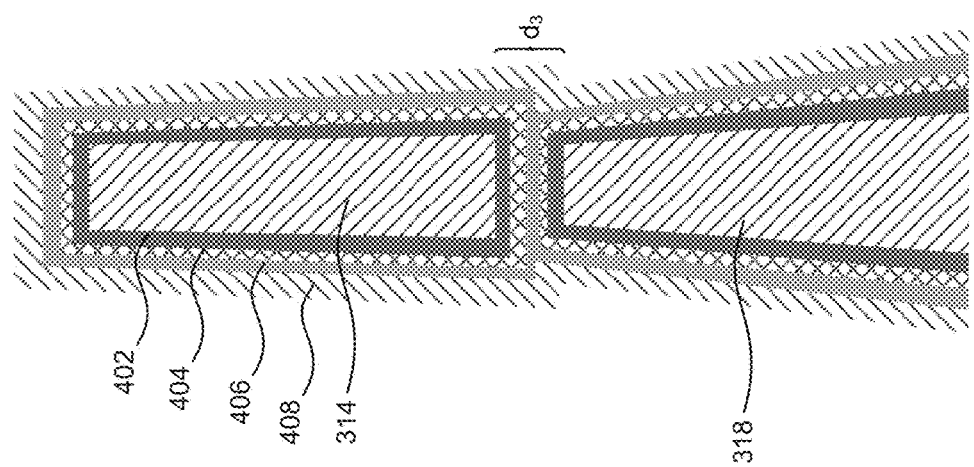

FIG. 4C illustrates first fin 314 and second fin 318 having a gap thickness $d_3$ that may be between about 5 nm and 8 nm, according to an embodiment. The gap is filled with first dielectric layer 402, second dielectric layer 404, and third dielectric layer 406. Each of dielectric layers 402, 404, and 406 may be deposited using ALD to provide a conformal coating around first fin 314 and second fin 318 while filling the gap between the two fins. Metallic layer 408 may be deposited over the stack of dielectric layers 402, 404, and 406. Metallic layer 408 may be deposited using ALD, chemical vapor deposition (CVD), or sputtering.

FIG. 4D illustrates first fin 314 and second fin 318 having a gap thickness $d_4$ that may be greater than about 8 nm, according to an embodiment. The gap is filled with first dielectric layer 402, second dielectric layer 404, third dielectric layer 406, and metallic layer 408. Each of dielectric layers 402, 404, and 406 and metallic layer 408 may be deposited using ALD to provide a conformal coating around first fin 314 and second fin 318 while filling the gap between the two fins.

Figure 4E:
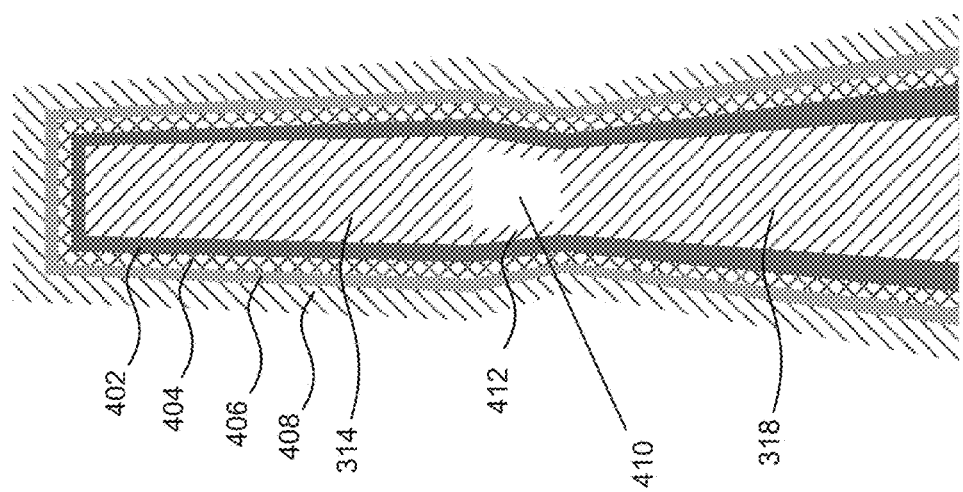

FIG. 4E illustrates first fin 314 and second fin 318 having an airgap 410 between the two fins, according to an embodiment. Airgap 410 may be created by epitaxially growing additional silicon bridges 412 that connect first fin 314 and second fin 318 and completely enclose the area making up airgap 410. First dielectric layer 402, second dielectric layer 404, third dielectric layer 406, and metallic layer 408 may each be deposited in succession over the remaining structure. Each of the layers may be deposited using ALD, chemical vapor deposition (CVD), or sputtering. First dielectric layer 402, second dielectric layer 404, and third dielectric layer 406 may also be deposited using flowable CVD.

In one embodiment, a semiconductor device includes a first fin formed in a first semiconductor layer, a second fin formed in a second semiconductor layer, and an insulating layer disposed between the first fin and the second fin. The first fin, the second fin, and the insulating layer form a stacked structure above a substrate. Sidewalls of the first fin are substantially more vertical than sidewalls of the second fin.

The first semiconductor layer and the second semiconductor layer may include silicon and the first fin and the second fin may be connected via one or more silicon bridges formed along sides of the insulating layer.

In another embodiment, a method of fabricating a semiconductor device includes etching a first semiconductor layer to form a first fin, etching an intermediate layer beneath the first fin, and etching a second semiconductor layer to form a second fin. The etching of the intermediate layer laterally etches the intermediate layer beneath the first fin. The first fin, the intermediate layer, and the second fin form a stacked structure above a substrate.

Sidewalls of the first fin may be more vertically aligned compared to sidewalls of the second fin following the etching of the first semiconductor layer and the etching of the second semiconductor layer. In an embodiment, the first and second semiconductor layers are doped silicon, and the fabrication method also includes forming silicon bridges that connect the first fin and the second fin along sides of the intermediate layer. The fabrication method may also include removing the intermediate layer and replacing it with an insulating layer, where the intermediate layer includes silicon germanium and the insulating layer includes silicon dioxide.

In another embodiment, a method of fabricating a semiconductor device includes applying a first RF power to etch a first semiconductor layer to form a first fin, etching an intermediate layer beneath the first fin using a wet etching process, and applying a second RF power to etch a second semiconductor layer to form a second fin. The etching of the intermediate layer laterally etches the intermediate layer beneath the first fin. The first fin, the intermediate layer, and the second fin form a stacked structure above a substrate. The first RF power is greater than the second RF power.

It is to be appreciated that the Detailed Description section, and not the Abstract of the Disclosure section, is intended to be used to interpret the claims. The Abstract section may set forth one or more but not all exemplary embodiments of the present invention as contemplated by the inventor(s), and thus, is not intended to limit the present invention and the appended claims in any way.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

What is claimed is:

1. A method of fabricating a semiconductor device, comprising:
   etching a first semiconductor layer to form a first fin;
   after etching the first semiconductor layer, etching an intermediate layer, provided beneath the first semiconductor layer, such that the intermediate layer is laterally etched beneath the first fin; and
   after etching the intermediate layer, etching a second semiconductor layer to form a second fin, wherein the first fin, the intermediate layer, and the second fin form a stacked structure above a substrate, and wherein sidewalls of the first fin are substantially more vertical than sidewalls of the second fin following the etching of the first semiconductor layer and the etching of the second semiconductor layer.

2. The method of claim 1, wherein the first and second semiconductor layers comprise silicon, and wherein the method further comprises forming silicon bridges that connect the first fin and the second fin along sides of the intermediate layer.

3. The method of claim 1, further comprising replacing the intermediate layer with an insulating layer.

4. The method of claim 3, wherein the intermediate layer comprises silicon germanium and the insulating layer comprises silicon dioxide.

5. The method of claim 1, further comprising epitaxially growing a material to form a source/drain adjacent to the first fin and the second fin.

6. The method of claim 1, wherein the intermediate layer is laterally etched between 1 nm and 3 nm.

7. The method of claim 1, wherein a difference between a top width of the first fin and a bottom width of the second fin is less than 3 nm.

8. The method of claim 1, wherein the intermediate layer is lattice matched with the first semiconductor layer and the second semiconductor layer.

9. The method of claim 1, wherein the intermediate layer is an etch stop.

10. A method of fabricating a semiconductor device, comprising:
  applying a first RF power to facilitate etching a first semiconductor layer to form a first fin;
  after etching the first semiconductor layer, etching an intermediate layer, provided beneath the first semiconductor layer, using a wet etching process such that the intermediate layer is laterally etched beneath the first fin; and
  after etching the intermediate layer, applying a second RF power to facilitate etching a second semiconductor layer to form a second fin, wherein the first fin, the intermediate layer, and the second fin form a stacked structure above a substrate, wherein the first RF power is greater than the second RF power.

11. The method of claim 10, wherein the first RF power is between 200 W and 400 W and the second RF power is between 100 W and 300 W.

12. The method of claim 10, wherein the first and second semiconductor layers comprise silicon, and wherein the method further comprises forming silicon bridges that connect the first fin and the second fin along sides of the intermediate layer.

13. The method of claim 10, further comprising replacing the intermediate layer with an insulating layer.

14. The method of claim 10, wherein a difference between a top width of the first fin and a bottom width of the second fin is less than 3 nm.

15. The method of claim 10, wherein the intermediate layer is laterally etched between 1 nm and 3 nm.

16. A method of fabricating a semiconductor device, comprising:
  etching, with a first etching process, a first semiconductor layer to form a first fin;
  after etching the first semiconductor layer and with a second etching process different from the first etching process, etching an intermediate layer beneath the first semiconductor layer, such that at least a portion of the intermediate layer is etched beneath the first fin;
  after etching the intermediate layer beneath the first semiconductor layer, etching a second semiconductor layer to form a second fin beneath the first fin;
  forming bridges between the first fin and the second fin along sides of the intermediate layer; and
  removing the intermediate layer such that an opening is formed between the first fin and the second fin.

17. The method of claim 16, further comprising depositing one or more insulating layers within the opening between the first fin and the second fin.

18. The method of claim 17, wherein at least one of the one or more insulating layers comprises a first high-K dielectric material.

19. The method of claim 18, wherein at least one of the one or more insulating layers comprises a second high-K dielectric material different from the first high-K dielectric material.

20. The method of claim 16, wherein sidewalls of the first fin formed following the etching of the first semiconductor layer are more vertically aligned than sidewalls of the second fin formed following the etching of the second semiconductor layer.

* * * * *